United States Patent
Wu et al.

(10) Patent No.: US 9,189,333 B2
(45) Date of Patent: Nov. 17, 2015

(54) GENERATING SOFT DECODING INFORMATION FOR FLASH MEMORY ERROR CORRECTION USING HARD DECISION PATTERNS

(71) Applicant: Seagate Technology LLC, Cupertino, CA (US)

(72) Inventors: Yunxiang Wu, Cupertino, CA (US); Zhengang Chen, San Jose, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 59 days.

(21) Appl. No.: 14/064,524

(22) Filed: Oct. 28, 2013

(65) Prior Publication Data

US 2015/0113354 A1    Apr. 23, 2015

Related U.S. Application Data

(60) Provisional application No. 61/892,328, filed on Oct. 17, 2013.

(51) Int. Cl.
*G06F 11/10* (2006.01)
*G11C 29/52* (2006.01)
*G11C 29/04* (2006.01)

(52) U.S. Cl.
CPC ............ *G06F 11/1068* (2013.01); *G11C 29/52* (2013.01); *G11C 2029/0411* (2013.01)

(58) Field of Classification Search
CPC .................................................. G06F 11/1076
USPC ..................................................... 714/764, 763
See application file for complete search history.

(56) References Cited

U.S. PATENT DOCUMENTS

| 8,468,429 | B2 | 6/2013 | Gunnam |
| 8,553,821 | B1* | 10/2013 | Eliaz .............................. 375/348 |
| 2008/0107190 | A1 | 5/2008 | Zhong et al. |
| 2009/0132755 | A1* | 5/2009 | Radke ............................ 711/103 |
| 2011/0209031 | A1* | 8/2011 | Kim et al. ..................... 714/763 |

* cited by examiner

*Primary Examiner* — Fritz Alphonse
(74) *Attorney, Agent, or Firm* — Daniel J. Santos; Smith Risley Tempel Santos LLC

(57) ABSTRACT

A flash memory controller having soft-decoding error correcting code (ECC) logic generates log likelihood ratio or similar ECC decoder soft input information from decision patterns obtained from reading data from the same portion of flash memory two or more times. Each decision pattern corresponds to a voltage region bordering one of the reference voltages. Each decision pattern represents a combination of flash memory bit value decisions for a cell voltage within the voltage region corresponding to the decision pattern when a corresponding combination of the reference voltages are used to read the cell. Numerical values are then computed in response to combinations of the flash memory bit value decisions represented by the decision patterns. The numerical values are provided to the soft-decoding ECC logic to serve as soft input information.

20 Claims, 9 Drawing Sheets

| NO. OF READS | DECISION PATTERNS FOR LSB OF MLC | LLR |
|---|---|---|
| 1 | 1 | 1 |
|   | 0 | -1 |
| 2 | 1 1 | 2 |
|   | 0 1 | 0 |
|   | 0 0 | -2 |
| 3 | 1 1 1 | 3 |
|   | 0 1 1 | 1 |
|   | 0 0 1 | -1 |
|   | 0 0 0 | -3 |
| 4 | 1 1 1 1 | 4 |
|   | 0 1 1 1 | 2 |
|   | 0 0 1 1 | 0 |
|   | 0 0 0 1 | -2 |
|   | 0 0 0 0 | -4 |
| 5 | 1 1 1 1 1 | 5 |
|   | 1 1 1 1 0 | 3 |
|   | 0 0 1 1 1 | 1 |
|   | 0 0 0 1 1 | -1 |
|   | 0 0 0 0 1 | -3 |
|   | 0 0 0 0 0 | -5 |
| 6 | 1 1 1 1 1 1 | 6 |
|   | 0 1 1 1 1 1 | 4 |
|   | 0 0 1 1 1 1 | 2 |
|   | 0 0 0 1 1 1 | 0 |
|   | 0 0 0 0 1 1 | -2 |
|   | 0 0 0 0 0 1 | -4 |
|   | 0 0 0 0 0 0 | -6 |
| 7 | 1 1 1 1 1 1 1 | 7 |
|   | 1 1 1 1 1 1 0 | 5 |
|   | 1 1 1 1 1 0 0 | 3 |
|   | 0 0 0 1 1 1 1 | 1 |
|   | 0 0 0 0 1 1 1 | -1 |
|   | 0 0 0 0 0 1 1 | -3 |
|   | 0 0 0 0 0 0 1 | -5 |
|   | 0 0 0 0 0 0 0 | -7 |

FIG. 9

| NO. OF READS | DECISION PATTERNS FOR MSB OF MLC | LLR |
|---|---|---|
| 1 | 0 | -1 |
| | 1 | 1 |
| 2 | 0 0 | -2 |
| | 1 0 | 0 |
| | 1 1 | 2 |
| | 0 1 | 0 |
| 3 | 0 0 0 | -3 |
| | 1 0 0 | -1 |
| | 1 1 0 | 1 |
| | 1 1 1 | 3 |
| | 0 1 1 | 1 |
| | 0 0 1 | -1 |
| 4 | 0 0 0 0 | -4 |
| | 1 0 0 0 | -2 |
| | 1 1 0 0 | 0 |
| | 1 1 1 0 | 2 |
| | 1 1 1 1 | 4 |
| | 0 1 1 1 | 2 |
| | 0 0 1 1 | 0 |
| | 0 0 0 1 | -2 |
| 5 | 0 0 0 0 0 | -5 |
| | 1 0 0 0 0 | -3 |
| | 1 1 0 0 0 | -1 |
| | 1 1 1 0 0 | 1 |
| | 1 1 1 1 0 | 3 |
| | 1 1 1 1 1 | 5 |
| | 0 1 1 1 1 | 3 |
| | 0 0 1 1 1 | 1 |
| | 0 0 0 1 1 | -1 |
| | 0 0 0 0 1 | -3 |

FIG. 10A

| | | | | | | | |
|---|---|---|---|---|---|---|---|
| | 0 | 0 | 0 | 0 | 0 | 0 | -6 |
| | 1 | 0 | 0 | 0 | 0 | 0 | -4 |
| | 1 | 1 | 0 | 0 | 0 | 0 | -2 |
| | 1 | 1 | 1 | 0 | 0 | 0 | 0 |
| | 1 | 1 | 1 | 1 | 0 | 0 | 2 |
| | 1 | 1 | 1 | 1 | 1 | 0 | 4 |
| 6 | 1 | 1 | 1 | 1 | 1 | 1 | 6 |
| | 0 | 1 | 1 | 1 | 1 | 1 | 4 |
| | 0 | 0 | 1 | 1 | 1 | 1 | 2 |
| | 0 | 0 | 0 | 1 | 1 | 1 | 0 |
| | 0 | 0 | 0 | 0 | 1 | 1 | -2 |
| | 0 | 0 | 0 | 0 | 0 | 1 | -4 |
| | 0 | 0 | 0 | 0 | 0 | 0 | -7 |
| | 1 | 0 | 0 | 0 | 0 | 0 | -5 |
| | 1 | 1 | 0 | 0 | 0 | 0 | -3 |
| | 1 | 1 | 1 | 0 | 0 | 0 | -1 |
| | 1 | 1 | 1 | 1 | 0 | 0 | 1 |
| | 1 | 1 | 1 | 1 | 1 | 0 | 3 |
| 7 | 1 | 1 | 1 | 1 | 1 | 1 | 5 |
| | 1 | 1 | 1 | 1 | 1 | 1 | 7 |
| | 0 | 1 | 1 | 1 | 1 | 1 | 5 |
| | 0 | 0 | 1 | 1 | 1 | 1 | 3 |
| | 0 | 0 | 0 | 1 | 1 | 1 | 1 |
| | 0 | 0 | 0 | 0 | 1 | 1 | -1 |
| | 0 | 0 | 0 | 0 | 0 | 1 | -3 |

FIG. 10B

GENERATING SOFT DECODING INFORMATION FOR FLASH MEMORY ERROR CORRECTION USING HARD DECISION PATTERNS

CROSS-REFERENCE TO RELATED APPLICATION

The benefit of the filing date of U.S. Provisional Patent Application No. 61/892,328, filed Oct. 17, 2013, entitled "GENERATING SOFT DECODING INFORMATION FOR FLASH MEMORY ERROR CORRECTION USING HARD DECISION PATTERNS," is hereby claimed and the specification thereof incorporated herein in its entirety by this reference.

FIELD OF INVENTION

The invention relates generally to flash memory controllers and, more specifically, to soft-decoding error correction in flash memory controllers.

BACKGROUND

A flash memory is a non-volatile electrically erasable data storage device that evolved from electrically erasable programmable read-only memory (EEPROM). The two main types of flash memory are named after the logic gates that their storage cells resemble: NAND and NOR. NAND flash memory is commonly used in solid-state drives, which are supplanting magnetic disk drives in many applications. A NAND flash memory is commonly organized as multiple blocks, with each block organized as multiple pages. Each page comprises multiple cells. Each cell is capable of storing an electric charge. Some cells are used for storing data bits, while other cells are used for storing error-correcting code bits. A cell configured to store a single bit is known as a single-level cell (SLC). A cell configured to store two bits is known as a multi-level cell (MLC). In an MLC cell, one bit is commonly referred to as the least-significant bit (LSB), and the other as the most-significant bit (MSB). A cell configured to store three bits is known as a triple-level cell (TLC). Writing data to a flash memory is commonly referred to as "programming" the flash memory, due to the similarity to programming an EEPROM.

The electric charge stored in a cell can be detected in the form of a cell voltage. To read an SLC flash memory cell, the flash memory controller provides one or more reference voltages (also referred to as read voltages) to the flash memory device. Detection circuitry in the flash memory device will interpret the bit as a "0" if the cell voltage is greater than a reference voltage Vref and will interpret the bit as a "1" if the cell voltage is less than the reference voltage Vref. Thus, an SLC flash memory requires a single reference voltage Vref. In contrast, an MLC flash memory requires three such reference voltages, and a TLC flash memory requires seven such reference voltages. Thus, reading data from an MLC or TLC flash memory device requires that the controller provide multiple reference voltages having optimal values that allow the memory device to correctly detect the stored data values.

Determining or detecting stored data values using controller-provided reference voltages is hampered by undesirable physical non-uniformity across cells of a device that are inevitably introduced by the fabrication process, as such non-uniformity results in the reference voltages of different cells that store the same bit value being significantly different from each other. The detection is further hampered by target or optimal reference voltages changing over time due to adverse effects of changes in temperature, interference from programming neighboring cells, and numerous erase-program cycles. Errors in detecting stored data values are reflected in the performance measurement known as bit error rate (BER). The use of error-correcting codes (ECCs) can improve BER to some extent, but the effectiveness of ECCs diminishes as improved fabrication processes result in smaller cell features.

As illustrated in FIG. 1, an MLC flash memory has four cell voltage distributions 102, 104, 106 and 108 with four respective mean target cell voltages Vtarget0 112, Vtarget1 114, Vtarget2 116 and Vtarget3 118. Such cell voltage distributions commonly overlap each other slightly, but such overlap is not shown in FIG. 1 for purposes of clarity. During a read operation, to attempt to characterize or detect the two bits of cell data (i.e., the LSB and MSB) a flash memory device (not shown) uses three reference voltages it receives from a flash memory controller (not shown): Vref0 122, Vref1 124 and Vref2 126. More specifically, the flash memory device compares the cell voltage with Vref1 124 to attempt to detect the LSB. If the flash memory device determines that the cell voltage is less than Vref1 124, i.e., within a window 128, then the flash memory device characterizes the LSB as a "1". If the flash memory device determines that the cell voltage is greater than Vref1 124, i.e., within a window 130, then the flash memory device characterizes the LSB as a "0". The flash memory device also compares the cell voltage with Vref0 122 and Vref2 126 to attempt to detect the MSB. If the flash memory device determines that the cell voltage is between Vref0 122 and Vref2 126, i.e., within a window 132, then the flash memory device characterizes the MSB as a "0". If the flash memory device determines that the cell voltage is either less than Vref0 122 or greater than Vref2 126, i.e., within a window 134, then the flash memory device characterizes the MSB as a "1".

The most commonly employed ECCs are hard-decoded codes, such as BCH codes. To improve BER beyond what is commonly achievable with hard-decoded ECCs, flash memory controllers may employ soft-decoded ECCs, such as low density parity check (LDPC) ECCs. Soft decoding is more powerful in correcting errors than hard decoding, but soft input information must be provided to the ECC decoding logic. The ECC decoder soft input information is commonly provided in the form of log likelihood ratio (LLR) information. Since a flash memory device conventionally only provides hard decision outputs, i.e., it characterizes each data bit that it reads as either a "1" bit or a "0" bit in the manner described above, employing soft decoding requires that the flash memory controller generate ECC decoder soft input information.

One method that has been employed for generating ECC decoder soft input information (e.g., LLRs) in an MLC flash memory controller involves computing a function of the reference voltages used to read the memory device and the means and variances of the four cell voltage distributions 102, 104, 106 and 108. A faster method that has been employed for generating ECC decoder soft input information in a flash memory controller has been to map a "1" bit (hard decision) to a first fixed or predetermined value and map a "0" bit (hard decision) to a second fixed or predetermined value. For example, a "1" bit may be mapped to a decimal value of "6", and a "0" bit may be mapped to a decimal value of "−6". Thus, such a flash memory controller's ECC decoding logic would use decimal "6" as soft input information in response to the flash memory device reading a "1" bit and would use decimal "−6" as soft input information in response to the flash memory device reading a "0" bit. The decimal value pair of "+6" and "−6" are still hard decision values in a strict mathematical sense, but it is understood that hard decision values are a special case of soft decision values.

Despite the benefits of employing soft-decoded ECCs, a page read sometimes fails. That is, the BER is so great that ECC decoding is unable to correct all erroneous bits. A common method for responding to such a page read failure is known as a "retry" or "read retry." In a read retry, the flash memory controller may adjust the reference voltage that was used to read the page and then try to read the page again using the adjusted reference voltage.

To improve BER, it would be desirable to provide an improved method and system for generating LLR information from flash memory device hard decision outputs.

SUMMARY

Embodiments of the invention relate to a flash memory controller having soft-decoding error correcting code (ECC) logic, in which log likelihood ratio or similar ECC decoder soft input information is generated from decision patterns corresponding to reading data from the same portion of flash memory a plurality of times using a corresponding plurality of different reference voltages. In an exemplary method, data is read from a portion of a flash memory a plurality of times using a plurality of different reference voltages, each time reading data from the portion of the flash memory using a different reference voltage from all other times. The plurality of different reference voltages are distributed over a voltage range that is substantially centered on an estimated mid-point between a pair of adjacent target cell voltages. A plurality of decision patterns is determined based on the voltage regions bordering the reference voltages. Each decision pattern corresponds to a voltage region bordering one of the reference voltages. Each decision pattern represents a combination of flash memory bit value decisions for a cell voltage within the voltage region corresponding to the decision pattern when a corresponding combination of the reference voltages are used to read the cell. A plurality of numerical values are then generated. Each numerical value is computed in response to the combination of the flash memory bit value decisions in each decision pattern. The plurality of numerical values is provided to the soft-decoding ECC logic, which the soft-decoding ECC logic uses as soft input information to attempt to decode the data that was read.

BRIEF DESCRIPTION OF THE FIGURES

FIG. 9 is a table relating number of times the same LSB portion of a flash memory device is read using different reference voltages to ordered sets of decision patterns and corresponding log likelihood ratios.

FIG. 10A is a table relating number of times the same MSB portion of a flash memory is read using different reference voltages to ordered sets of decision patterns and corresponding log likelihood ratios.

FIG. 10B a continuation of the table of FIG. 10A.

WRITTEN DESCRIPTION

Figure 1:
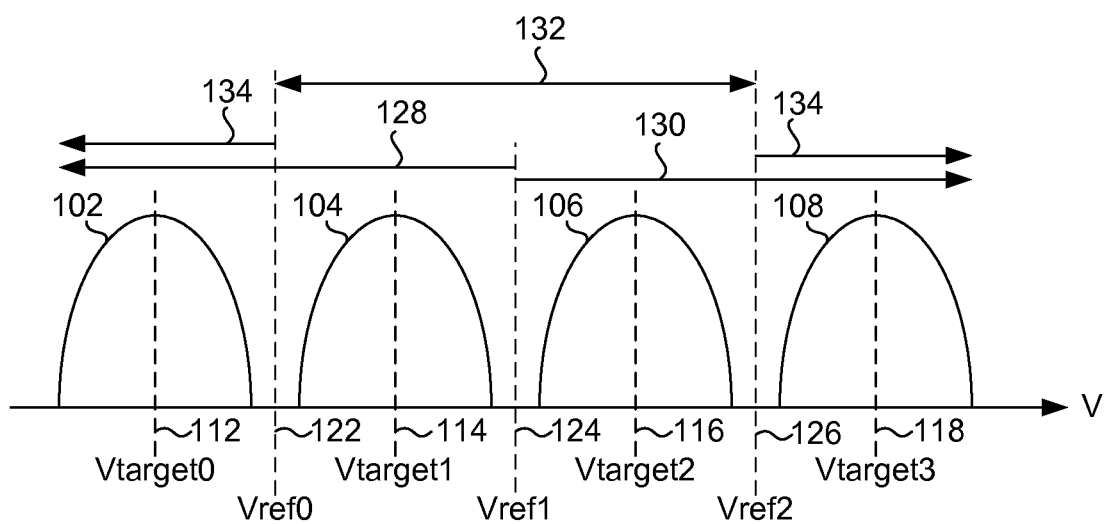
FIG. 1 is a plot of cell voltage distributions in a flash memory device, as known in the art.
Figure 2:
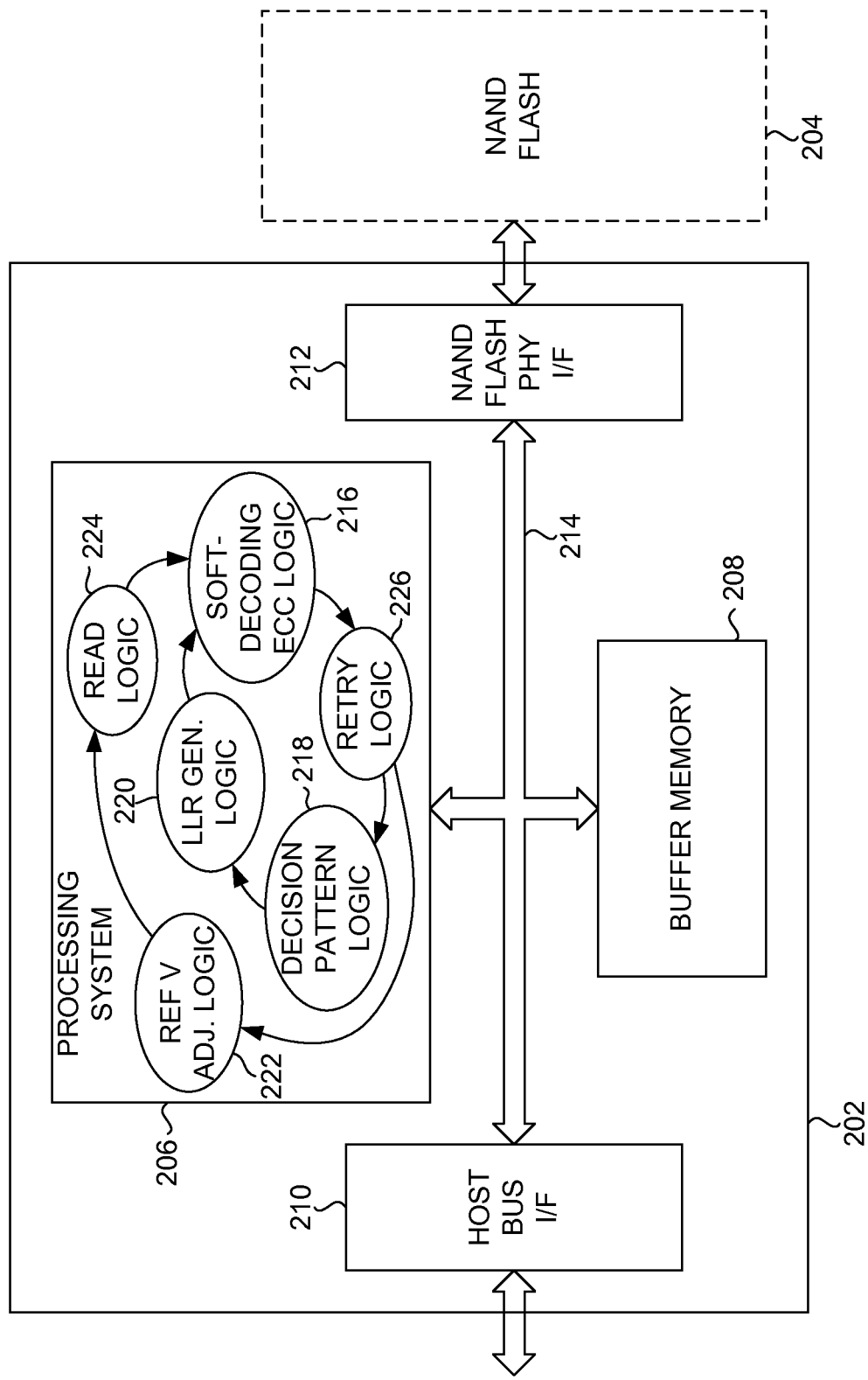
FIG. 2 is a block diagram of a flash memory controller, in accordance with an exemplary embodiment of the invention.

As illustrated in FIG. 2, in the exemplary embodiment a flash memory controller 202 can generate log likelihood ratio (LLR) values that aid soft-decoding of data read from, for example, a multi-level cell (MLC) flash memory device 204. The data stored in flash memory device 204 includes soft-decoded error-correcting codes (ECCs) such as low density parity check (LDPC) codes. Although only one flash memory device 204 is shown for purposes of clarity, flash memory controller 202 can control multiple flash memory devices. Flash memory controller 202 includes a processing system 206, a buffer memory 208, a host bus interface 210, and a NAND flash physical interface 212. Flash memory controller 202 can include additional elements, such as those that are commonly included in conventional flash memory controllers, but such other elements are not shown for purposes of clarity. The foregoing elements are interconnected by a data bus 214. Host bus interface 210 is used to interface flash memory controller 202 to an external system (not shown), such as a computer. Host bus interface 210 can be of any suitable conventional type. As such a host bus interface 210 is well understood by persons skilled in the art, it is not described herein in further detail. NAND flash physical interface 212 is used in the exemplary embodiment to interface flash memory controller 202 to MLC NAND flash memory device 204 and can be of any suitable conventional type. As such a NAND flash physical interface 212 is well understood by persons skilled in the art, it is not described herein in further detail. Buffer memory 208 is used to temporarily store data that is read from MLC NAND flash memory device 204 and can be of any suitable conventional type, such as static random access memory.

Although not shown for purposes of clarity, processing system 206 can comprise one or more suitable processors, such as central processing units, digital signal processors or other specialized processors, etc., and suitable memory from which such processors execute instructions. Processing system 206 can comprise any suitable combination of hardware, software, firmware, etc. Conceptually shown for illustrative purposes as residing in processing system 206 are a number of logic elements: soft-decoding ECC logic 216, decision pattern logic 218, LLR generating logic 220, and reference voltage adjusting logic 222, as well as read logic 224 for generally coordinating the reading of data from flash memory device 204 in response to requests received via host bus interface 210 and read retry logic 226 for initiating a read retry if a read error occurs on a read operation. Such logic elements can be defined by hardware logic, by execution of software or firmware (instructions) by a processor, or by any other suitable means. Such logic elements configure processing system 206 to effect the methods described below.

Figure 3:
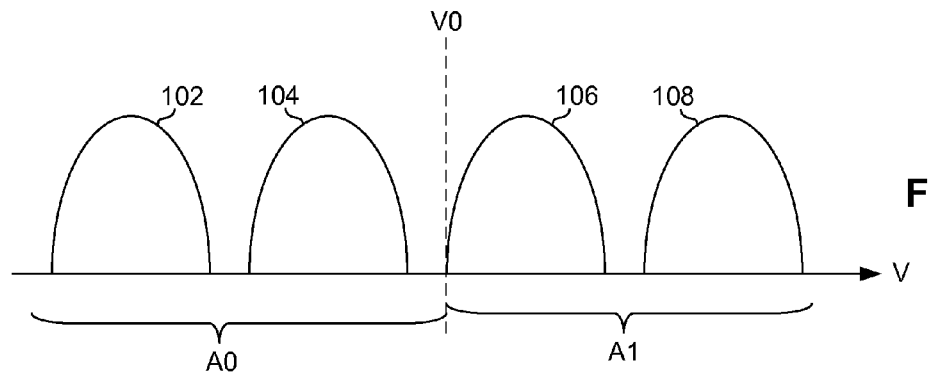
FIG. 3 is a plot of flash memory cell voltage distributions and one reference voltage used in the exemplary method in relation to reading the LSBs of memory cells in an MLC flash memory device.

As illustrated in FIG. 3, in an instance in which flash memory controller 202 effects a single read operation on a single cell of flash memory device 204 using a reference voltage V0, voltage windows A0 and A1 serve as the criteria by which flash memory device 204 detects or makes a hard decision as to the value of the least-significant bit (LSB). In such an instance, flash memory device 204 outputs a hard decision value of "1" for the read data (LSB) if the cell voltage is less than V0, i.e., in the voltage range or decision region A0, and outputs a hard decision value of "0" if the cell voltage is greater than V0, i.e., in the voltage range or decision region A1. Thus, for the ordered set of decision regions {A0, A1} there is an ordered set of corresponding decision patterns {1, 0}. Note that each decision pattern corresponds to a voltage region bordering one of the reference voltages.

Figure 4:
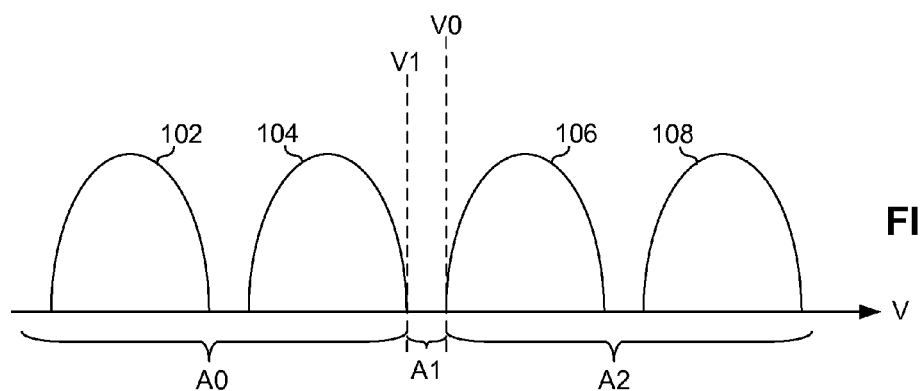
FIG. 4 is a plot of flash memory cell voltage distributions and two reference voltages used in the exemplary method in relation to reading the LSBs of memory cells in an MLC flash memory device.

As illustrated in FIG. 4, in an instance in which flash memory controller 202 effects two read operations on a single cell of flash memory device 204 using two reference voltages V0 and V1, respectively, voltage windows A0, A1 and A2 serve as the criteria by which flash memory device 204 detects or makes a hard decision as to the value of the LSB. A first reference voltage V0 is used to read a cell, and a second reference voltage V1 that is incrementally less than V0 is used to read the same cell. If the cell voltage is less than V0, i.e., in the voltage range or decision region A0, then the hard decision value that flash memory device 204 outputs for the read data (LSB) produced in response to the use of the first reference voltage V0 is a "1", and the hard decision value that flash memory device 204 outputs for the read data (LSB) produced in response to the use of the second reference voltage V1 is a "1". If the cell voltage is between V0 and V1, i.e., in the voltage range or decision region A1, then the hard decision value that flash memory device 204 outputs for the read data (LSB) produced in response to the use of the first reference voltage V0 is a "0", and the hard decision value that flash memory device 204 outputs for the read data (LSB) produced in response to the use of the second reference voltage V1 is a "1". If the cell voltage is greater than V1, i.e., in the voltage range or decision region A2, then the hard decision value that flash memory device 204 outputs for the read data (LSB) produced in response to the use of the first reference voltage V0 is a "0", and the hard decision value that flash memory device 204 outputs for the read data (LSB) produced in response to the use of the second reference voltage V1 is a "0". Thus, for the ordered set of decision regions {A0, A1, A2} there is an ordered set of three corresponding two-bit decision patterns {11, 01, 00}. The left bit in each two-bit decision pattern corresponds to the use of the first reference voltage V0, and the right bit in each two-bit decision pattern corresponds to the use of the second reference voltage V1. Note that each decision pattern corresponds to a voltage region bordering one of the reference voltages.

Figure 5:
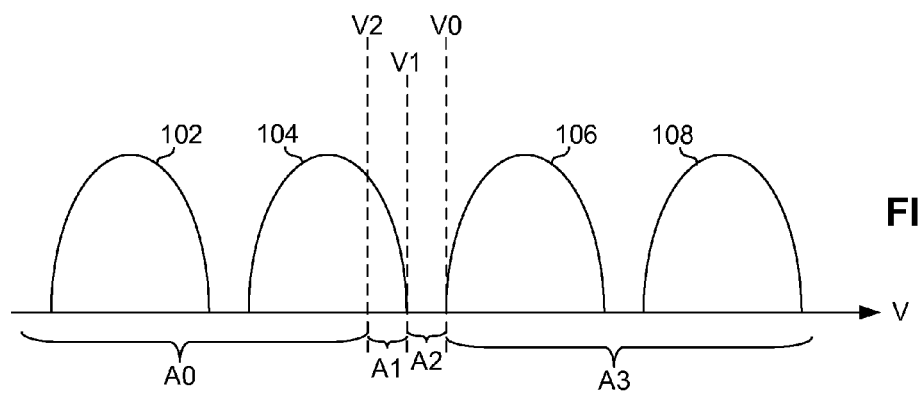
FIG. 5 is a plot of flash memory cell voltage distributions and three reference voltages used in the exemplary method in relation to reading the LSBs of memory cells in an MLC flash memory device.

As illustrated in FIG. 5, in an instance in which flash memory controller 202 effects three read operations on a single cell of flash memory device 204 using three reference voltages V0, V1 and V2, respectively, voltage windows A0, A1, A2 and A3 serve as further criteria by which flash memory device 204 detects or makes a hard decision as to the value of the LSB. A first reference voltage V0 is used to read a cell, a second reference voltage V1 that is incrementally less than V0 is used to read the same cell, and a third reference voltage V2 that is incrementally less than V1 is also used to read the same cell. If the cell voltage is less than V0, i.e., in the voltage range or decision region A0, then the hard decision value that flash memory device 204 outputs for the read data (LSB) produced in response to the use of the first reference voltage V0 is a "1", the hard decision value that flash memory device 204 outputs for the read data (LSB) produced in response to the use of the second reference voltage V1 is a "1", and the hard decision value that flash memory device 204 outputs for the read data (LSB) produced in response to the use of the third reference voltage V2 is a "1". If the cell voltage is between V0 and V1, i.e., in the voltage range or decision region A1, then the hard decision value that flash memory device 204 outputs for the read data (LSB) produced in response to the use of the first reference voltage V0 is a "0", the hard decision value that flash memory device 204 outputs for the read data (LSB) produced in response to the use of the second reference voltage V1 is a "1", and the hard decision value that flash memory device 204 outputs for the read data (LSB) produced in response to the use of the third reference voltage V2 is a "1". If the cell voltage is between V1 and V2, i.e., in the voltage range or decision region A2, then the hard decision value that flash memory device 204 outputs for the read data (LSB) produced in response to the use of the first reference voltage V0 is a "0", the hard decision value that flash memory device 204 outputs for the read data (LSB) produced in response to the use of the second reference voltage V1 is a "0", and the hard decision value that flash memory device 204 outputs for the read data (LSB) produced in response to the use of the third reference voltage V2 is a "1". If the cell voltage is greater than V2, i.e., in the voltage range or decision region A3, then the hard decision value that flash memory device 204 outputs for the read data (LSB) produced in response to the use of the first reference voltage V0 is a "0", the hard decision value that flash memory device 204 outputs for the read data (LSB) produced in response to the use of the second reference voltage V1 is a "0", and the hard decision value that flash memory device 204 outputs for the read data (LSB) produced in response to the use of the third reference voltage V2 is a "0". Thus, for the ordered set of decision regions {A0, A1, A2} there is an ordered set of four corresponding three-bit decision patterns {111, 011, 001, 000}. The leftmost decision value in each three-bit decision pattern corresponds to the use of the first reference voltage V0, the middle decision value in each three-bit decision pattern corresponds to the use of the second reference voltage V1, and the rightmost decision value in each three-bit decision pattern corresponds to the use of the third reference voltage V2. Note that each decision pattern corresponds to a voltage region bordering one of the reference voltages.

Although exemplary instances are described above with regard to FIGS. 3, 4 and 5 in which flash memory controller 202 uses one, two and three reference voltages, respectively, to read data from flash memory device 204, it should be understood that flash memory controller 202 can use any other number of reference voltages. In all such instances, the reference voltages span a range, which can be substantially centered between the target cell voltages specified by the manufacturer of flash memory device 204 for reference voltage distributions 104 and 106, as these target cell voltages generally approximate the means of cell voltage distributions 104 and 106. Also note that a suitable voltage increment or delta between successive voltages in the sequence (i.e., the width of each voltage region) such as between V0 and V1, between V1 and V2, between V2 and V3, etc., readily can be determined (e.g., empirically) by one skilled in the art. Although for purposes of illustration in the exemplary embodiment the voltage delta is uniform, in other embodiments there can be non-uniform or different voltage deltas between different pairs of adjacent reference voltages. Also, although for purposes of illustration in the exemplary embodiment the reference voltage is decremented such that successive voltages in the sequence are incrementally less than each other, in other embodiments the reference voltages can be incremented or decremented. A sequence could even alternate or otherwise vary between a voltage greater than a value centered between target cell voltages and a voltage less than that value. For example: {0.4V, −0.1V, −0.05V, 0.1V, 0.3V}, where "0" represents the center between target cell voltages.

Figure 6:
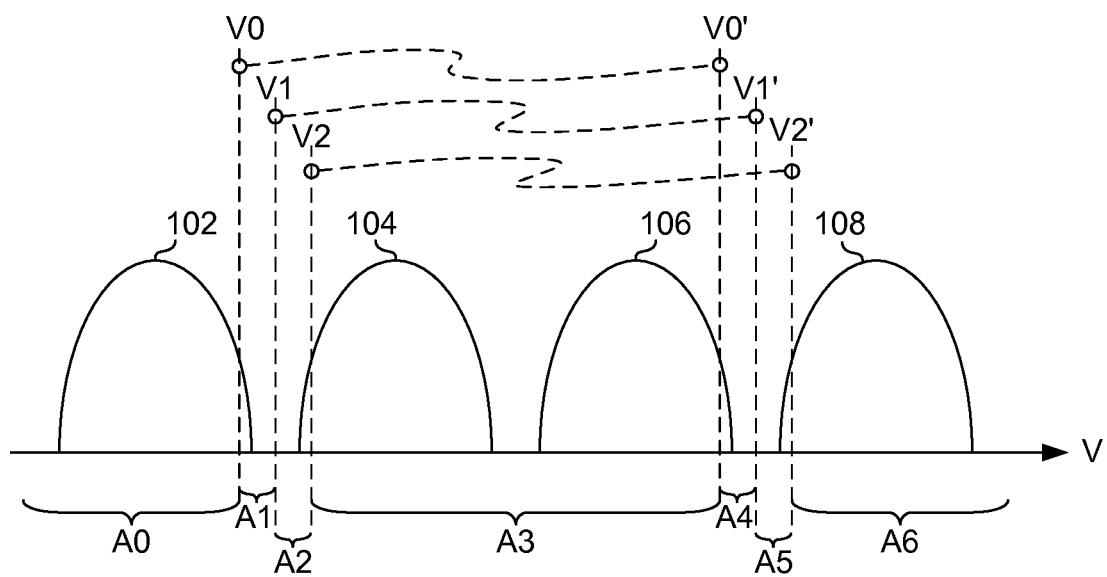
FIG. 6 is a plot of flash memory cell voltage distributions and three reference voltages used in the exemplary method in relation to reading the MSBs of memory cells in an MLC flash memory device.

The same principle described above with regard to decision patterns for the LSB stored in a cell of MLC flash memory device 204 applies to decision patterns for the MSB stored in a cell of MLC flash memory device 204. As illustrated in FIG. 6, in an instance in which flash memory controller 202 effects three read operations on a single cell of flash memory device 204 using three reference voltage pairs V0/V0', V1/V1' and V2/V2', respectively, voltage windows A0, A1, A2, A3, A4, A5 and A6 serve as criteria for detecting the MSB stored in a cell. Each cell is read three times in this example. A first pair of reference voltages V0 and V0' are used to read a cell, a second pair of reference voltages V1 and V1' are used to read the same cell, and a third pair of reference voltages V2 and V2' are also used to read the same cell. The second voltage in each pair can be greater than the first voltage by a fixed amount or increment that readily can be determined (e.g., empirically) by one skilled in the art. For the ordered set of seven decision regions {A0, A1, A2, A3, A4, A5, A6} there is an ordered set of seven corresponding three-bit decision patterns {111, 011, 001, 000, 100, 110, 111}. Note that since Gray coding is used, the same decision pattern that corresponds to decision region A0 also corresponds to decision region A6. The leftmost decision value in each three-bit decision pattern corresponds to the use of the first pair of reference voltages V0 and V0', the middle decision value in each three-bit decision pattern corresponds to the use of the second pair of reference voltages V1 and V1', and the rightmost decision value in each three-bit decision pattern corresponds to the use of the third pair of reference voltages V2 and V2'. As in the examples described above, in this example each decision pattern corresponds to a voltage region bordering one of the reference voltages.

Figure 7:
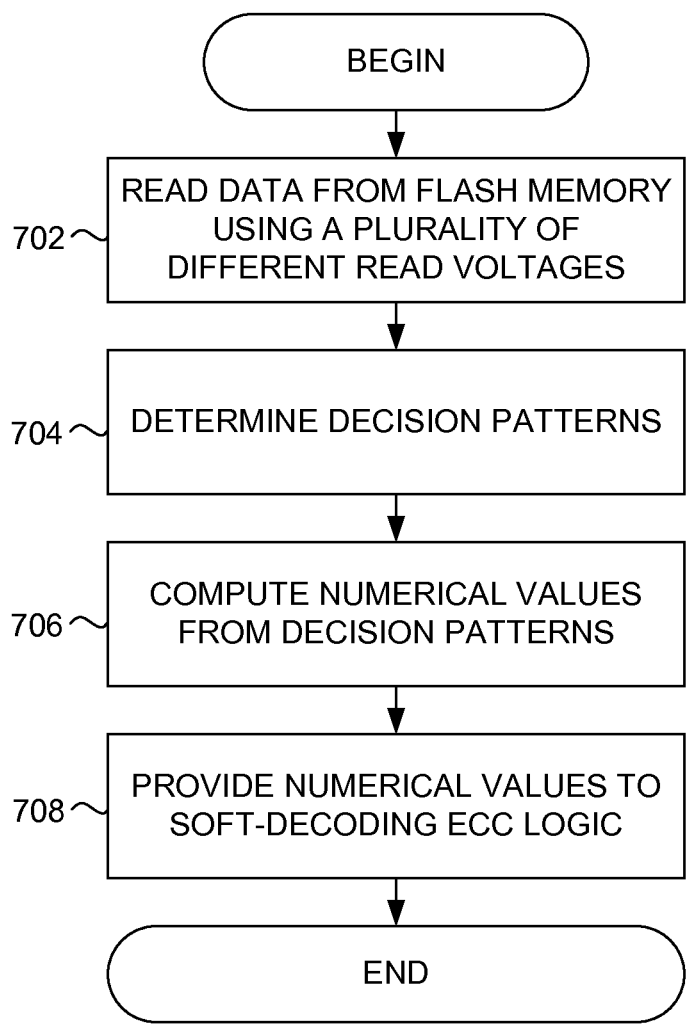
FIG. 7 is a flow diagram for a method of operation of a flash memory controller, in accordance with an exemplary embodiment of the invention.
Figure 8:
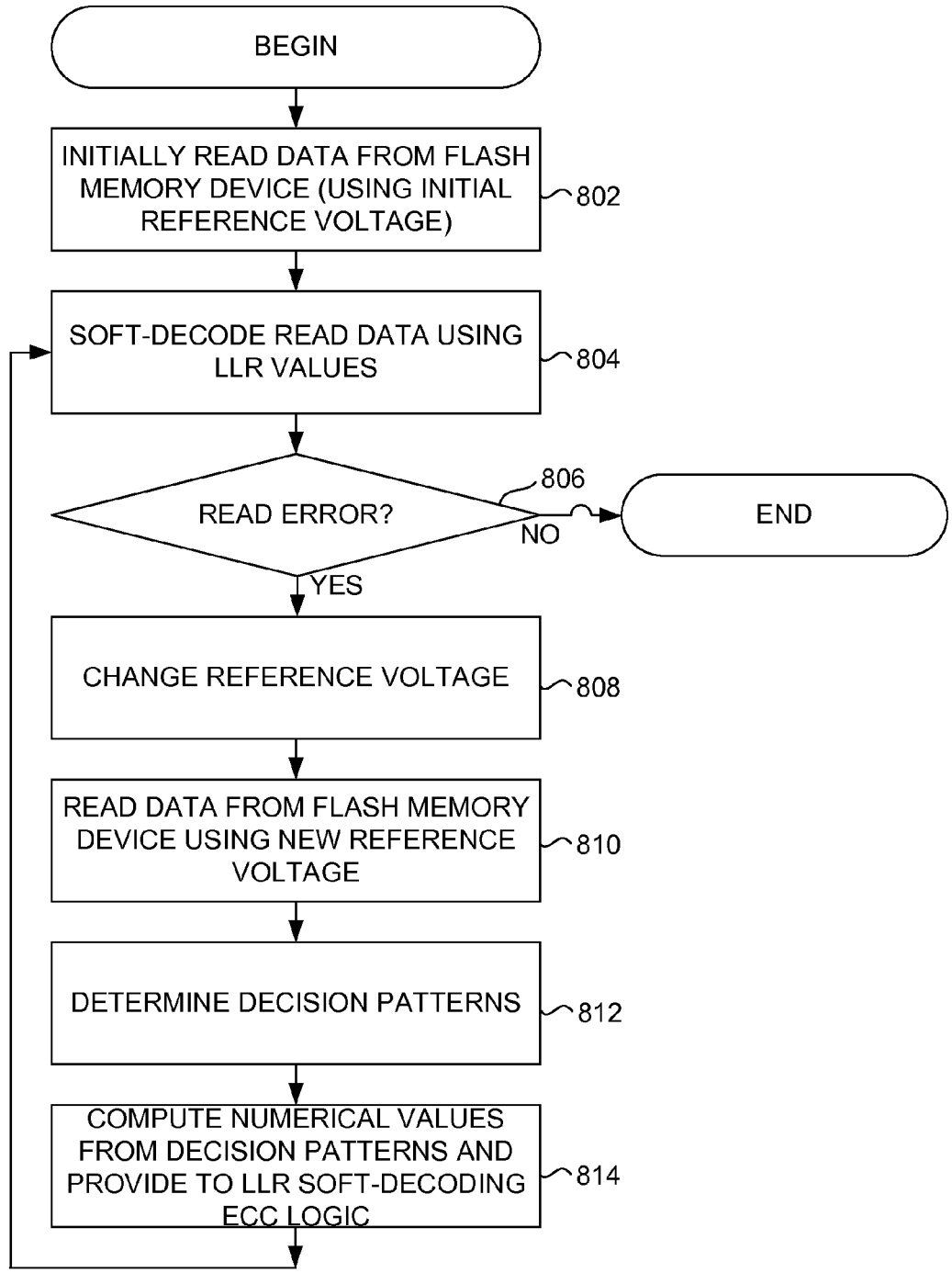
FIG. 8 is a flow diagram for another method of operation of a flash memory controller, in accordance with another exemplary embodiment of the invention.

A method of operation is first described broadly with regard to FIG. 7, and then a more specific embodiment is described with regard to FIG. 8. As illustrated in FIG. 7, an exemplary method of operation is represented by blocks 702, 704, 706 and 708. As indicated by block 702, flash memory controller 202 (FIG. 2) reads one or more pages of data from MLC NAND flash memory device 204 using a plurality of reference voltages. That is, flash memory controller 202 reads each cell of each of one or more pages N times, each time using a different reference voltage, where N is an integer greater than one. Flash memory controller 202 can temporarily store this read data in its buffer memory 208. Read logic 224 (FIG. 2) can contribute to the configuration of processing system 206 to effect these aspects of the method.

As indicated by block 704, flash memory controller 302 determines a plurality of decision patterns of the type described above with regard to FIGS. 3-5. Decision pattern logic 218 (FIG. 2) can contribute to the configuration of processing system 206 to effect these aspects of the method. As described above, each such decision pattern corresponds to a voltage region bordering one of the reference voltages. Note that for N reads of the LSBs in MLC NAND flash memory device 204 there are N+1 decision patterns, and for N reads of the MSBs in MLC NAND flash memory device 204 there are 2N decision patterns.

As indicated by block 706, flash memory controller 202 generates numerical values (e.g., LLRs) from the decision patterns. LLR generating logic 220 (FIG. 2) can contribute to the configuration of processing system 206 to effect this aspect of the method. Flash memory controller 202 can generate numerical values from the decision patterns by, for example, computing an arithmetic combination of the flash memory decision values. For example, flash memory controller 202 can compute the weighted sum of the flash memory decision values. A decision value of "1" can be assigned a weight of, for example, "1" and a decision value of "0" can be assigned a weight of, for example, "−1". As described above, each decision pattern comprises one or more decision values.

For example, as described above with regard to FIG. 4, in an instance in which flash memory controller 202 effects two read operations using two reference voltages V0 and V1, there is an ordered set of three corresponding decision patterns {11, 01, 00}. In this example, each of the three decision patterns in the ordered set consists of two decision values. Flash memory controller 202 can compute the weighted sum of the two decision values of which the first decision pattern consists by summing their weights of "1" and "1", respectively, yielding a sum of (decimal) "2". Flash memory controller 202 can compute the weighted sum of the two decision values of which the second decision pattern consists by summing their weights of "−1" and "1", respectively, yielding a sum of (decimal) "0". Flash memory controller 202 can compute the weighted sum of the two decision values of which the third decision pattern consists by summing their weights of "−1" and "1", respectively, yielding a sum of (decimal) "−2". Thus, in this exemplary instance in which flash memory controller 202 effects two read operations using two reference voltages, flash memory controller 202 generates three numerical values: 2, 0 and −2. As indicated by block 708 (FIG. 7), in such an instance these numerical values are provided to soft-decoding ECC logic 216, which uses the numerical values as soft input information (e.g., LLRs).

Similarly, for example, as described above with regard to FIG. 5, in an instance in which flash memory controller 202 effects three read operations using three reference voltages V0, V1 and V2, there is an ordered set of four corresponding decision patterns {111, 011, 001, 000}. In this example, each of the four decision patterns in the ordered set consists of three decision values. Flash memory controller 202 can compute the weighted sum of the three decision values of which the first decision pattern consists by summing their weights of "1", "1" and "1", respectively, yielding a sum of (decimal) "3". Flash memory controller 202 can compute the weighted sum of the three decision values of which the second decision pattern consists by summing their weights of "−1", "1" and "1", respectively, yielding a sum of (decimal) "1". Flash memory controller 202 can compute the weighted sum of the three decision values of which the third decision pattern consists by summing their weights of "1", "−1" and "1", respectively, yielding a sum of (decimal) "−1". Flash memory controller 202 can compute the weighted sum of the three decision values of which the fourth decision pattern consists by summing their weights of "1", "−1" and "1", respectively, yielding a sum of (decimal) "−3". Thus, in this exemplary instance in which flash memory controller 202 effects three read operations using three reference voltages, flash memory controller 202 generates three numerical values: 3, 1, −1 and −3. As indicated by block 708 (FIG. 7), these numerical values are provided to soft-decoding ECC logic 216, which uses the numerical values as soft input information (e.g., LLRs).

As illustrated in FIG. 8, another exemplary method of operation is represented by blocks 802, 804, 806, 808, 810, 812 and 814. As indicated by block 802, flash memory controller 202 (FIG. 2) performs an initial read operation of one or more pages of data from MLC NAND flash memory device 204 using a an initial reference voltage. This initial read operation can occur in response to a read request received from a host via host bus interface 210 (FIG. 2). Flash memory controller 202 can temporarily store this initial read data in its buffer memory 208. Read logic 224 (FIG. 2) can contribute to the configuration of processing system 206 to effect these aspects of the method. Note that read logic 224 obtains only hard decision information from memory device 204.

As indicated by block 804, flash memory controller 202 performs soft-decoding of the initial read data to determine whether a read error occurred. Soft-decoding ECC logic 216 can an contribute to the configuration of processing system 206 to effect these aspects of the method. The soft input information can be in the form of LLRs. That is, soft-decoding ECC logic 216 can comprise a log likelihood decoder that uses LLRs as soft input information. In performing soft-decoding of the initial read data, flash memory controller 202 can provide the LLRs in any suitable manner, such as by mapping the hard decision outputs of memory device 204 to fixed or predetermined values. For example, flash memory controller 202 can map every "1" data bit (hard decision) to a decimal value of "6" and map ever "0" data bit to a decimal value of "−6". Thus, soft-decoding ECC logic 216 receives a decimal "6" as an LLR along with every "1" data bit that memory device 204 indicates (i.e., a hard decision) it has read and receives a decimal "−6" as an LLR along with every "0" data bit that memory device 204 indicates (i.e., a hard decision) it has read.

As indicated by block 806, if it is determined that no read error occurred on the initial read operation, then flash memory controller 202 can continue to operate in a conventional manner. That is, it can continue to perform read or write operations upon flash memory device 204 in response to corresponding requests received from a host. Such further read operations can be performed in accordance with blocks 802-806 as described above. Until such time as a read error occurs, all such further read operations can be characterized as "initial" read operations. Mapping hard decision outputs of memory device 204 to fixed or predetermined values in the manner described above is a fast way to generate LLRs. However, if a read error occurs on an initial read operation, then it may be useful to generate "better" LLRs, i.e., LLRs that include more information about the read operation, in an attempt to avoid a read error. The remainder of the method of FIG. 8 relates to generating better LLRs when an initial read operation results in an error.

The tables of FIGS. 9 and 10A-B indicate the corresponding decision patterns and LLRs for up to seven read operations performed on the same portion of memory device 204. For N reads of the LSB, where N can be any number from one to seven, the table of FIG. 9 includes the corresponding N+1 decision patterns and thus the corresponding N+1 LLRs computed in the manner described above. Similarly, for N reads of the MSB, where N can be any number from one to seven, the table of FIG. 10A-B includes the corresponding 2N decision patterns and thus the corresponding 2N LLRs computed in the manner described above. Note in FIGS. 9 and 10A-B that each ordered set of decision patterns follows a Gray code pattern. LLR generation logic 220 (FIG. 2) can include or otherwise access such tables or similar data for use in computing the LLRs. Note that the above-described exemplary instance in which two read operations are performed using two different reference voltages is reflected in the table of FIG. 9 where the table indicates that a set of two reads of the LSB yields the three LLRs 2, 0 and −2. Note that the above-described exemplary instance in which three read operations are performed using three different reference voltages is also reflected in the table of FIG. 9 where the table indicates that a set of three reads of the LSB yields the four LLRs 3, 1, −1 and −3. The table of FIG. 9 further indicates the LLRs that four, five, six and seven reads of the LSB yield. Likewise, the table of FIG. 10 indicates the LLRs that one, two, three, four, five, six and seven reads of the MSB yield. Although two or more reads are performed on the portion of flash memory 204 in accordance with exemplary methods for generating LLRs, for purposes of completeness the tables of FIG. 9 and FIG. 10A-B include the LLRs that a single read yields.

Referring again to FIG. 8, if it is determined that a read error occurred on an initial read operation, then flash memory controller 202 changes or adjusts the reference voltage used to read memory device 204, as indicated by block 808. For example, flash memory controller 202 can decrement the reference voltage. If a read error occurs on an nth read operation using an nth reference voltage, flash memory controller 202 determines an (n+1)th reference voltage by, for example, decrementing the nth reference voltage. Note that in the exemplary instances described above with regard to FIGS. 3-5, the first reference voltage used in the first read is V0, the second reference voltage used in the second read is V1, the third reference voltage used in the third read is V2, and an nth reference voltage (not shown) used in an nth read would be Vn. Reference voltage adjusting logic 222 (FIG. 2) can contribute to the configuration of processing system 206 to effect these aspects of the method.

As indicated by block 810, flash memory controller 202 then reads data from the portion of memory device 204 an nth time using an nth reference voltage Vn that is different from the reference voltages that have been used in re-reading the portion of memory device 204 following the initial read error. Flash memory controller 202 can temporarily store this read data in its buffer memory 208. Retry logic 226 and read logic 224 (FIG. 2) can contribute to the configuration of processing system 206 to effect these aspects of the method.

As indicated by block 812, in conjunction with reading data from the portion of memory device 204 an nth time (block 810) using an nth reference voltage Vn, flash memory controller 202 determines n+1 decision patterns of the type described above with regard to FIGS. 3-5 (or determines only the (n+1)th decision pattern if the remaining n decision patterns have already been determined). Note that the tables of FIGS. 9 and 10A-B list all decision patterns for a first through a seventh read of both the LSB (FIG. 9) and MSB (FIG. 10A-B). Decision pattern logic 218 (FIG. 2) can contribute to the configuration of processing system 206 to effect these aspects of the method.

As indicated by block 814, flash memory controller 202 generates LLRs (i.e., numerical values) from the decision patterns associated with the combination of the n reference voltages that have been used in re-reading the portion of memory device 204 following a read error on an initial read. Flash memory controller 202 can generate each LLR in the manner described above; namely, by computing a weighted sum or otherwise obtaining a weighted sum of the decision values in each decision pattern, with each "0" decision value assigned a weight of "−1" and each "1" decision value assigned a weight of "1". Note that having read data from the portion of memory device 204 an nth time using an nth reference voltage Vn, flash memory controller 202 generates n+1 LLRs that are to be used in decoding the LSB and 2n LLRs that are to be used in decoding the MSB, as indicated in the tables of FIG. 9 and FIG. 10A-B, respectively. LLR generating logic 220 (FIG. 2) can contribute to the configuration of processing system 206 to effect these aspects of the method. LLR generating logic 220 can generate the LLRs by obtaining the information shown in the tables of FIGS. 9 and 10A-B (i.e., by performing a table look-up). Alternatively, LLR generating logic 220 can generate the LLRs on the fly and compute weighted sums in the manner described above.

The method then proceeds as described above with regard to block 804. Thus, using the generated LLRs (block 814) as soft input information, flash memory controller 202 performs soft decoding of the read data output by flash memory device 204 on the nth read following an initial read error. As described above with regard to block 804, this soft decoding results in a determination of whether a read error occurred. The method continues in the manner described herein with regard to FIG. 8 until either no read error occurs or a maximum number of reads following an initial read error have been performed, such as five, six, seven, etc. (For illustrative purposes the tables of FIG. 9 and FIG. 10A-B indicate LLRs for up to seven reads, but persons skilled in the art are readily capable of extending such tables to any number of reads.)

It should be understood that the flow diagrams of FIGS. 7 and 8 are intended only to be exemplary or illustrative of the logic underlying the above-described methods. In view of the descriptions herein, persons skilled in the art readily will be capable of programming or configuring a flash memory controller or similar system in any of various ways to effect the above-described methods and similar methods. The blocks described above with regard to FIGS. 7 and 8 are intended only as examples, and in other embodiments the steps or acts described above and similar steps or acts can occur in any other suitable order or sequence. Steps or acts described above can be combined with others or omitted in some embodiments. Similarly, the logic elements described above with regard to FIG. 2 are intended only as examples, and the logic underlying the above-described method can be modularized in any other suitable manner. In view of the descriptions herein, persons skilled in the art will readily be capable of programming or configuring flash memory controller 202 with suitable software or in suitable logic, such as in the form of an application-specific integrated circuit (ASIC) or similar device or combination of devices, to effect the above-described method and similar methods. Also, it should be understood that the combination of software instructions or similar logic and the memory in which such software instructions or similar logic is stored or embodied in non-transitory form for execution in processing system 206, comprises a "computer-readable medium" or "computer program product" as that term is used in the patent lexicon.

It should be noted that the invention has been described with reference to one or more exemplary embodiments for the purpose of demonstrating the principles and concepts of the invention. The invention is not limited to these embodiments. For example, although the above-described exemplary embodiment relates to MLC NAND flash memory, other embodiments can relate to SLC, TLC or any other suitable type of flash memory. As will be understood by persons skilled in the art, in view of the description provided herein, many variations may be made to the embodiments described herein and all such variations are within the scope of the invention.

What is claimed is:

1. A method for operation of a flash memory controller having soft-decoding error correcting code logic, comprising:
reading data from a portion of a flash memory in a plurality of instances using a plurality of different reference voltages, in each instance reading data from the portion of the flash memory using a different reference voltage from all other instances, the plurality of different reference voltages distributed over a voltage range, the voltage range substantially centered on an estimated midpoint between a pair of adjacent target cell voltages;
determining a plurality of decision patterns, each decision pattern corresponding to a voltage region bordering one of the reference voltages, each decision pattern representing a combination of flash memory decision values for a cell voltage within the voltage region corresponding to the decision pattern when a corresponding combination of the reference voltages are used to read the cell;
generating a plurality of numerical values, each numerical value computed in response to the combination of the flash memory decision values represented by each decision pattern; and
inputting the plurality of numerical values to the soft-decoding error correcting code logic.

2. The method of claim 1, wherein generating a plurality of numerical values comprises computing a weighted sum of the flash memory decision values.

3. The method of claim 1, wherein in computing the weighted sum each flash memory decision value of "1" has a weight of decimal "1" and each flash memory bit value decision of "0" has a weight of decimal "−1".

4. The method of claim 1, wherein the soft-decoding error correcting code logic comprises log likelihood ratio soft-decoding error correcting code logic.

5. The method of claim 1, further comprising:
reading data from a portion of a flash memory in an initial instance; and
the soft-decoding error correcting code logic determining whether a read error occurred;
wherein the steps of reading data from a portion of a flash memory in a plurality of instances using a plurality of different reference voltages, determining a plurality of decision patterns, generating a plurality of numerical values, and inputting the plurality of numerical values to soft-decoding error correcting code logic are performed in response to a determination that a read error occurred in response to reading data from the portion of the flash memory in the initial instance.

6. The method of claim 5, wherein:
if it is determined that a read error occurred, then the step of reading data from a portion of a flash memory in a plurality of instances using a plurality of different reference voltages further includes reading data in one or more additional instances following the initial instance and determining in each instance whether a read error occurred and further includes reading data in an nth instance using an nth reference voltage different from all other reference voltages, wherein n is an integer greater than two;
the step of determining whether a read error occurred includes determining whether a read error occurred in the nth instance;
if it is determined a read error occurred in the nth instance, then the step of determining a plurality of decision patterns includes determining an (n+1)th decision pattern corresponding to a voltage region bordering the nth reference voltage;
if it is determined a read error occurred in the nth, then the step of generating a plurality of numerical values includes determining instance an (n+1)th plurality of numerical values; and if it is determined a read error occurred in the nth instance, then the step of inputting the plurality of numerical values to soft-decoding error correcting code logic of the flash memory controller includes inputting the (n+1)th plurality of numerical values to the soft-decoding error correcting code logic of the flash memory controller.

7. The method of claim 1, wherein reading data from a portion of a flash memory in a plurality of instances using a plurality of different reference voltages comprises reading data using the estimated mid-point between two target cell voltages and reading data using incrementally higher and lower reference voltages from the estimated mid-point.

8. The method of claim 7, wherein a voltage increment between adjacent reference voltages is fixed, whereby all voltage regions are equal to each other in width.

9. A flash memory controller, comprising:
a buffer memory;
a processing system comprising:
soft-decoding error correcting code logic;
read logic for reading data into the buffer memory from a portion of a flash memory in a plurality of instances using a plurality of different reference voltages, in each instance reading data from the portion of the flash memory using a different reference voltage from all other instances, the plurality of different reference voltages distributed over a voltage range, the voltage range substantially centered on an estimated mid-point between a pair of adjacent target cell voltages;
decision pattern logic for determining a plurality of decision patterns, each decision pattern corresponding to a voltage region bordering one of the reference voltages, each decision pattern representing a combination of flash memory decision values for a cell voltage within the voltage region corresponding to the decision pattern when a corresponding combination of the reference voltages are used to read the cell; and
numerical value generating logic for generating a plurality of numerical values, each numerical value computed in response to the combination of the flash decision values represented by each decision pattern and for providing the plurality of numerical values to the soft-decoding error correcting code logic.

10. The flash memory controller of claim 9, wherein the numerical value generating logic computes a plurality of numerical values by computing a weighted sum of the flash memory decision values.

11. The flash memory controller of claim 9, wherein in computing the weighted sum the numerical value generating logic assigns each flash memory decision value of "1" a weight of decimal "1" and assigns each flash memory decision value of "0" a weight of decimal "−1".

12. The flash memory controller of claim 9, wherein the soft-decoding error correcting code logic comprises log likelihood ratio soft-decoding error correcting code logic.

13. The flash memory controller of claim 9, further comprising, further comprising read retry logic, wherein:
the soft-decoding error correcting code logic determines whether a read error occurred reading data from a portion of a flash memory in an initial instance;
the read retry logic causes the read logic, decision pattern logic and numerical value generating logic to read data, determine a plurality of decision patterns, compute a plurality of numerical values, and input the plurality of numerical values to the soft-decoding error correcting code logic in response to a determination by the soft-decoding error correcting logic that a read error occurred in response to reading data from the portion of the flash memory in the initial instance.

14. The flash memory controller of claim 13, wherein:
if the soft-decoding error correcting logic determines that a read error occurred, then the read retry logic causes the read logic to read data in one or more additional instances following the initial instance and determine in each instance whether a read error occurred and further to read data in an nth time instance using an nth reference voltage different from all other reference voltages, wherein n is an integer greater than two;
the soft-decoding error correcting logic determines whether a read error occurred in the nth instance;
if the soft-decoding error correcting logic determines a read error occurred in the nth instance, then the decision pattern logic determines an (n+1)th decision pattern corresponding to a voltage region bordering the nth reference voltage;
if the soft-decoding error correcting logic determines a read error occurred in the nth instance, then the numerical value generating logic determines an (n+1)th plurality of numerical values; and
if the soft-decoding error correcting logic determines a read error occurred in the nth instance, then the numerical value generating logic inputs the (n+1)th plurality of numerical values to the soft-decoding error correcting code logic.

15. The flash memory controller of claim 9, wherein the read logic reads data from a portion of a flash memory in a plurality of instances using a plurality of different reference voltages by reading data using the estimated mid-point between two target cell voltages and reading data using incrementally higher and lower reference voltages from the estimated mid-point.

16. The flash memory controller of claim 15, wherein a voltage increment between adjacent reference voltages is fixed, whereby all voltage regions are equal to each other in width.

17. A computer program product for flash memory control by a flash memory controller having soft-decoding error correcting code logic, the computer program product comprising a computer-readable medium having stored therein in computer-executable non-transitory form instructions that, when executed on a processing system of the flash memory controller, cause the processing system to effect a method comprising:
reading data from a portion of a flash memory in a plurality of instances using a plurality of different reference voltages, in each instance reading data from the portion of the flash memory using a different reference voltage from all other instances, the plurality of different reference voltages distributed over a voltage range, the voltage range substantially centered on an estimated mid-point between a pair of adjacent target cell voltages;
determining a plurality of decision patterns, each decision pattern corresponding to a voltage region bordering one of the reference voltages, each decision pattern representing a combination of flash memory decision values for a cell voltage within the voltage region corresponding to the decision pattern when a corresponding combination of the reference voltages are used to read the cell;
generating a plurality of numerical values, each numerical value computed in response to the combination of the flash memory decision values represented by each decision pattern; and inputting the plurality of numerical values to the soft-decoding error correcting code logic.

18. The computer program product of claim 17, wherein generating a plurality of numerical values comprises computing a weighted sum of the flash memory decision values.

19. The computer program product of claim 17, wherein in computing the weighted sum each flash memory bit value decision value of "1" has a weight of decimal "1" and each flash memory decision value of "0" has a weight of decimal "−1".

20. The computer program product of claim 17, wherein the soft-decoding error correcting code logic comprises log likelihood ratio soft-decoding error correcting code logic.

* * * * *